US012628271B2

(12) United States Patent
Fukae et al.

(10) Patent No.: US 12,628,271 B2
(45) Date of Patent: May 12, 2026

(54) ELECTRONIC COMPONENT

(71) Applicant: TDK Corporation, Tokyo (JP)

(72) Inventors: Yu Fukae, Tokyo (JP); Tomoya Hanai, Tokyo (JP); Yusuke Oba, Tokyo (JP); Kenichi Yoshida, Tokyo (JP); Katsuharu Yasuda, Tokyo (JP); Takashi Ohtsuka, Tokyo (JP)

(73) Assignee: TDK Corporation, Tokyo (JP)

( * ) Notice: Subject to any disclaimer, the term of this patent is extended or adjusted under 35 U.S.C. 154(b) by 546 days.

(21) Appl. No.: 18/044,869

(22) PCT Filed: Sep. 13, 2021

(86) PCT No.: PCT/JP2021/033550
§ 371 (c)(1),
(2) Date: Mar. 10, 2023

(87) PCT Pub. No.: WO2022/065108
PCT Pub. Date: Mar. 31, 2022

(65) Prior Publication Data
US 2023/0371175 A1 Nov. 16, 2023

(30) Foreign Application Priority Data

Sep. 28, 2020 (JP) ................................. 2020-162536

(51) Int. Cl.
*H05K 1/02* (2006.01)
*H05K 1/05* (2006.01)

(52) U.S. Cl.
CPC ............. *H05K 1/0298* (2013.01); *H05K 1/05* (2013.01); *H05K 2201/0338* (2013.01); *H05K 2201/09409* (2013.01)

(58) Field of Classification Search
CPC ...... H03H 7/00; H03H 7/0115; H03H 7/0161; H03H 7/0176; H05K 1/0298; H05K 1/0271; H05K 1/05
See application file for complete search history.

(56) References Cited

U.S. PATENT DOCUMENTS 4,918,570 A * 4/1990 Okamura ............. H03H 7/1725
29/25.42
2007/0194345 A1* 8/2007 Kuwajima ........... H03H 7/1775
257/107

(Continued)

FOREIGN PATENT DOCUMENTS

JP 2008-034626 A 2/2008

OTHER PUBLICATIONS

International Search Report issued in corresponding International Patent Application No. PCT/JP2021/033550, dated Nov. 30, 2021, with English translation.

*Primary Examiner* — Livius R. Cazan
(74) *Attorney, Agent, or Firm* — Rimon P.C.

(57) ABSTRACT

To prevent interfacial peeling due to the stress of an insulating layer in a capacitor-inductor integrated electronic component having three or more conductor layers. An electronic component includes: a conductor layer M1 including a conductor pattern constituting an inductor; a conductor pattern overlapping a part of the conductor pattern through a dielectric film; an insulating layer covering the conductor layer M1 and conductor pattern; a conductor layer M2 provided on the insulating layer and including a conductor pattern constituting the inductor; and an insulating layer covering the conductor layer M2. The conductor layer M2 is formed to be branching from or independently of the conductor pattern and further includes a dummy pattern overlapping the conductor pattern. This prevents the stress of the insulating layer from being directly applied to the (Continued)

conductor pattern to thereby prevent peeling at the interface between the conductor layer M1 and the dielectric film.

11 Claims, 7 Drawing Sheets

(56) References Cited

U.S. PATENT DOCUMENTS

| 2008/0023219 | A1* | 1/2008 | Yoshizawa | H10D 1/20 |
| | | | | 174/260 |
| 2008/0024242 | A1* | 1/2008 | Nam | H03H 7/463 |
| | | | | 333/132 |

* cited by examiner

ELECTRONIC COMPONENT

CROSS REFERENCE TO RELATED APPLICATIONS

This application is the U.S. National Phase under 35 U.S.C. § 371 of International Application No. PCT/JP2021/033550, filed on Sep. 13, 2021, which claims the benefit of Japanese Application No. 2020-162536, filed on Sep. 28, 2020, the entire contents of each are hereby incorporated by reference.

TECHNICAL FIELD

The present disclosure relates to an electronic component and, more particularly, to an electronic component integrating a capacitor and an inductor.

Background Art

As an electronic component integrating a capacitor and an inductor, an electronic component described in Patent Document 1 is known. The electronic component described in Patent Document 1 uses two conductor layers to constitute a series circuit of the capacitor and inductor.

CITATION LIST

Patent Document

[Patent Document 1] JP 2008-034626A

SUMMARY OF THE INVENTION

Problem to be Solved by the Invention

However, using three or more conductor layers for achieving an electronic component with higher function involves an increase in the stress of an insulating layer for insulating the conductor layers from one another, which may cause peeling at the interface between the stacked layers due to the stress of the insulating layer.

It is therefore an object of the present disclosure to prevent interfacial peeling due to the stress of the insulating layer in a capacitor-inductor integrated electronic component having three or more conductor layers.

Means for Solving the Problem

An electronic component according to the present disclosure includes: a first conductor layer including a first inductor pattern; a capacitor upper electrode overlapping a part of the first inductor pattern through a dielectric film; a first insulating layer covering the first conductor layer and upper electrode; a second conductor layer provided on the first insulating layer and including a second inductor pattern; and a second insulating layer covering the second conductor layer. One end of the second inductor pattern is connected to one end of the first inductor pattern through a first via formed in the first insulating layer. The part of the first inductor pattern functions as a capacitor lower electrode. The second conductor layer includes a dummy pattern overlapping the upper electrode and provided branching from or independently of the second inductor pattern.

According to the present disclosure, the presence of the dummy pattern overlapping the upper electrode prevents the stress of the second insulating layer from being directly applied to the upper electrode. This reduces the stress to be applied to the upper electrode to thereby prevent peeling at the interface between the first conductor layer and the dielectric film immediately below the upper electrode.

In the present disclosure, the upper electrode may be connected to the second inductor pattern through a second via formed in the first insulating layer. This can constitute a parallel circuit of a capacitor and an inductor. Alternatively, the second conductor layer may further include a conductor pattern provided separated from the second inductor pattern in the surface thereof, and the upper electrode may be connected to the conductor pattern through the second via formed in the first insulating layer. That is, the capacitor upper electrode and second inductor pattern need not be directly connected to each other.

In the present disclosure, the dummy pattern may be provided branching from the second inductor pattern, and the upper electrode may be entirely covered with or entirely overlapped by the dummy pattern or second inductor pattern. This can further reduce a stress to be applied to the upper electrode.

In the present disclosure, the dummy pattern may be provided independently of the second inductor pattern, and the upper electrode may be entirely covered with the dummy pattern or second inductor pattern except a part thereof that overlaps a slit separating the dummy pattern and the second inductor pattern. This prevents a variation in characteristics of the second inductor pattern caused due to the presence of the dummy pattern, facilitating designing.

In the present disclosure, the dummy pattern may have a plurality of openings exposing the first insulating layer. This makes it possible to release gas generated during curing of the first insulating layer from the openings even when the dummy pattern is large in area.

Advantageous Effects of the Invention

As described above, according to the present disclosure, it is possible to prevent interfacial peeling due to the stress of the insulating layer in a capacitor-inductor integrated electronic component having three or more conductor layers.

BRIEF DESCRIPTION OF THE DRAWINGS

FIG. 7A illustrates a state where no dummy pattern is present, and FIG. 7B illustrates a state where the conductor pattern 56 serving as the dummy pattern is present.

MODE FOR CARRYING OUT THE INVENTION

Hereinafter, preferred embodiments of technology with regard to the present disclosure will be described in detail with reference to the accompanying drawings.

Figure 1:
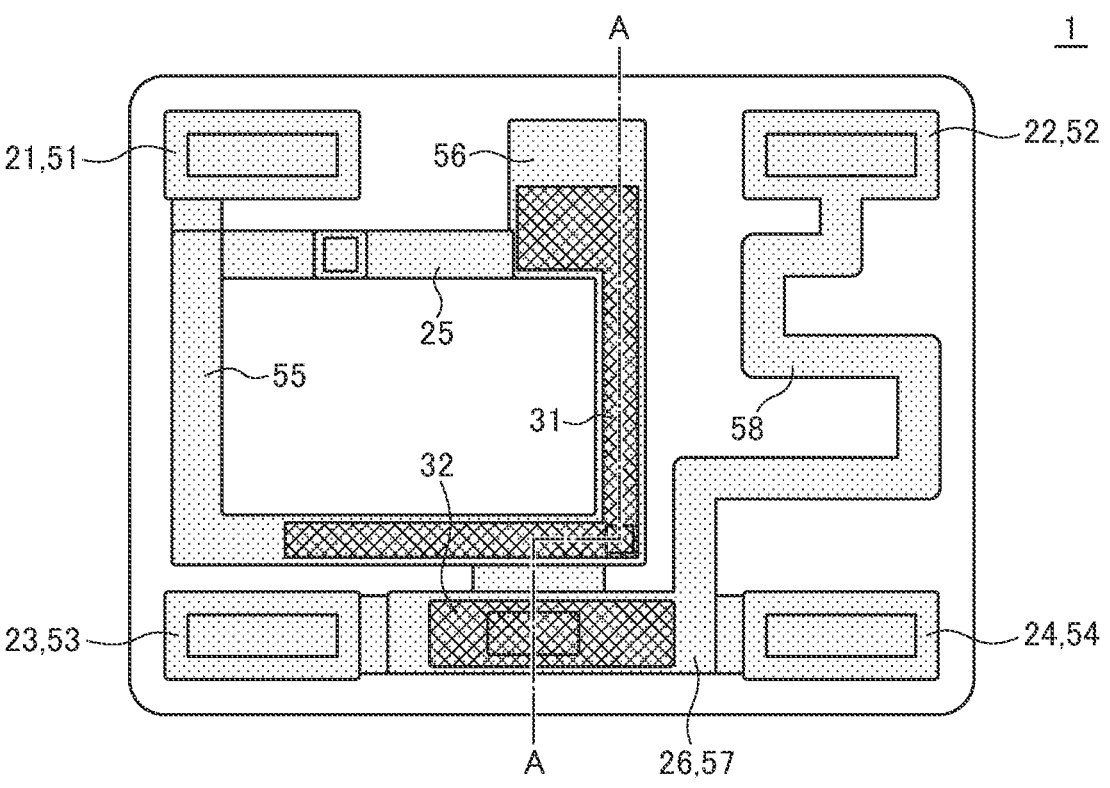
FIG. 1 is a schematic plan view for expanding the structure of an electronic component 1 according to one embodiment of the present disclosure.
Figure 2:
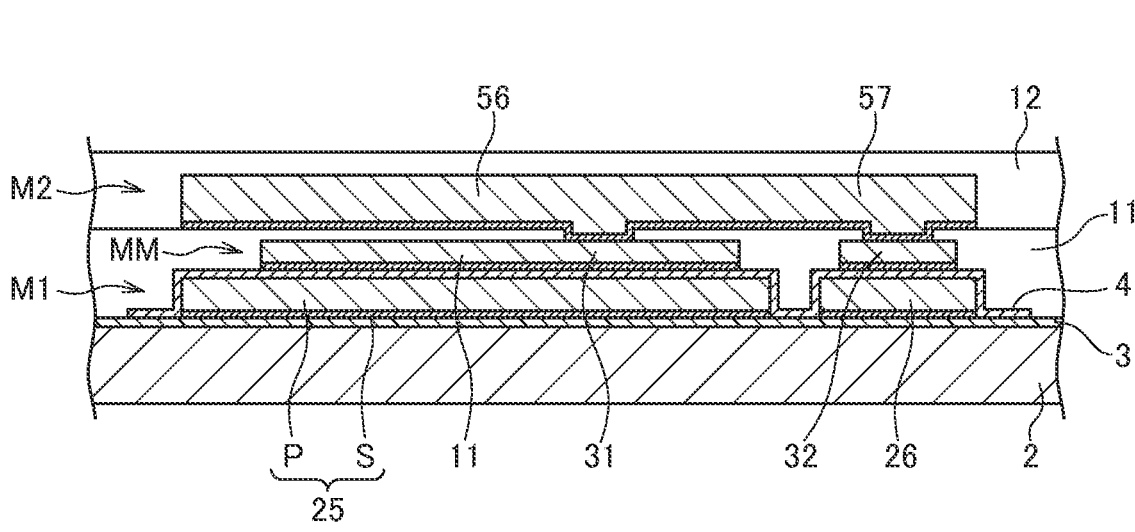
FIG. 2 is a schematic cross-sectional view taken along the line A-A in FIG. 1.

FIG. 1 is a schematic plan view for expanding the structure of an electronic component 1 according to one embodiment of the present disclosure. FIG. 2 is a schematic cross-sectional view taken along the line A-A in FIG. 1.

Figure 3:
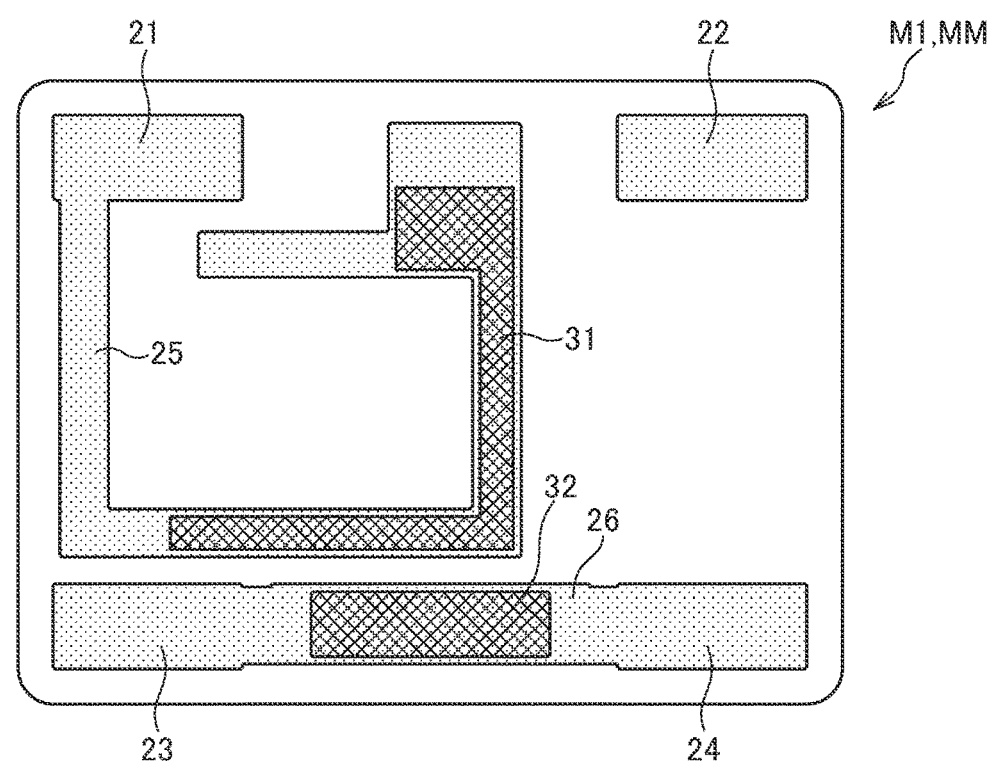
FIG. 3 is a schematic plan view illustrating the pattern shapes of the conductor layers M1 and MM.
Figure 4:
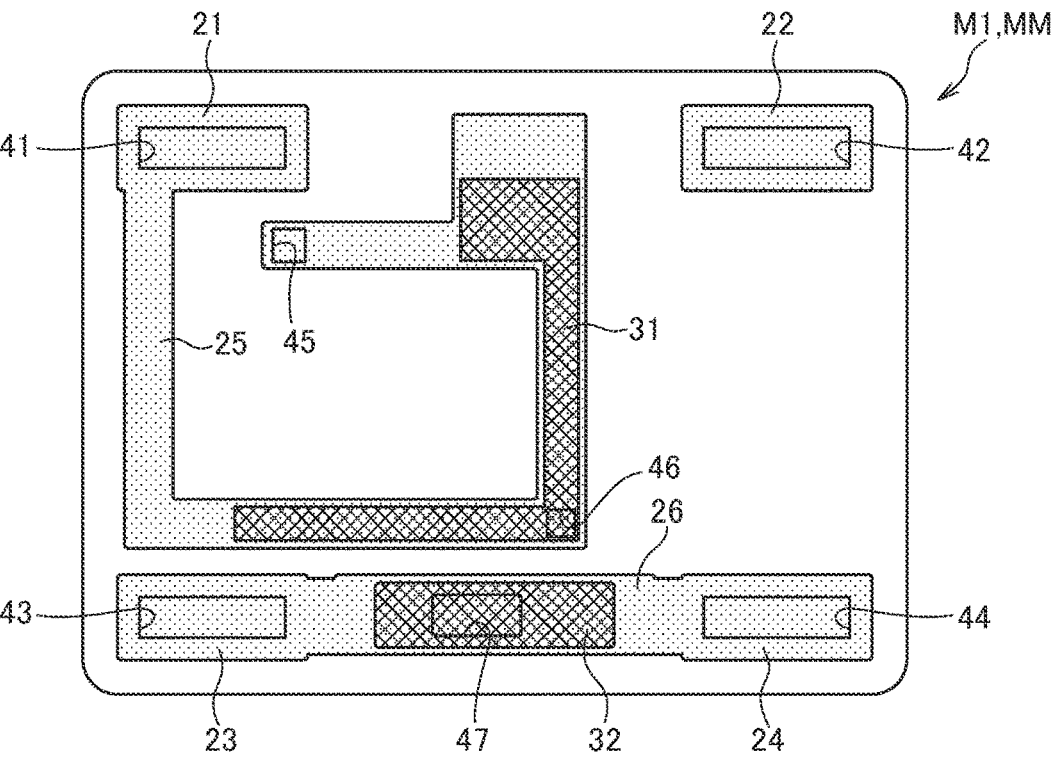
FIG. 4 is a schematic plan view illustrating the position of a via formed in the insulating layer 11.
Figure 5:
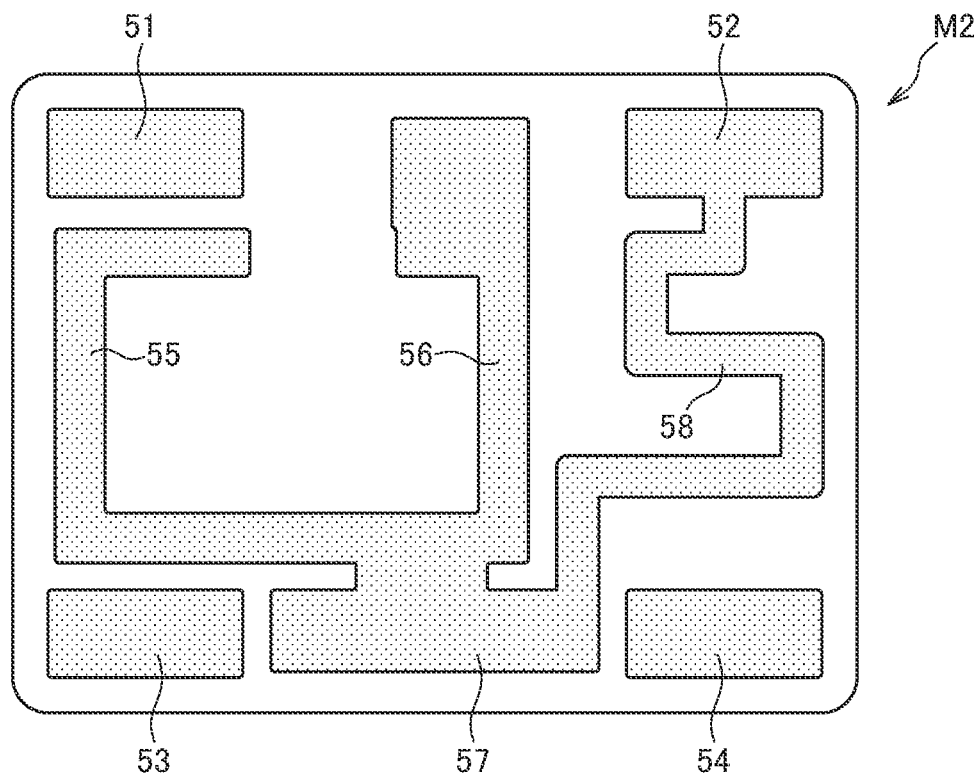
FIG. 5 is a schematic plan view illustrating the pattern shape of the conductor layer M2.

The electronic component 1 according to the present embodiment is an LC filter and includes, as illustrated in FIGS. 1 and 2, a substrate 2, conductor layers M1, MM, and M2, and insulating layers 11 and 12. The conductor layers M1, MM and M2 and insulating layers 11 and 12 are formed on the main surface of the substrate 2. The pattern shapes of the conductor layers M1 and MM are illustrated in FIG. 3, the position of a via formed in the insulating layer 11 is illustrated in FIG. 4, and the pattern shape of the conductor layer M2 is illustrated in FIG. 5. The material of the substrate 2 may be any material as long as it is chemically and thermally stable, generates less stress, and can maintain surface smoothness, and examples thereof include, but not particularly limited thereto, silicon single crystal, alumina, sapphire, aluminum nitride, MgO single crystal, $SrTiO_3$ single crystal, surface-oxidized silicon, glass, quartz, and ferrite. The surface of the substrate 2 is covered with a planarizing layer 3. The planarizing layer 3 may be made of, e.g., alumina or silicon oxide.

The conductor layer M1 is a layer positioned in the lowermost layer and includes, as illustrated in FIG. 3, conductor patterns 21 to 26. The conductor patterns 21 to 24 each serve as a terminal electrode pattern, the conductor pattern 25 having a loop-like shape serves both as an inductor pattern and a capacitor lower electrode, and the conductor pattern 26 serves as a capacitor lower electrode. One end of the conductor pattern 25 is connected to the conductor pattern 21. The conductor pattern 26 is connected to the conductor patterns 23 and 24. These conductor patterns 21 to 26 are each constituted of a thin seed layer S contacting the planarizing layer 3 and a plating layer P made of copper (Cu), provided on the seed layer S, and having a film thickness larger than that of the seed layer S. Similarly, the conductor patterns positioned in other conductor layers MM and M2 are each formed of a laminated body of the seed layer S and plating layer P.

Of the conductor patterns 21 to 26, at least the conductor patterns 25 and 26 constituting the capacitor lower electrode are covered at its upper surface with a dielectric film (capacitive insulating film) 4. The dielectric film 4 is made of an inorganic insulating material such as silicon nitride.

Conductor patterns 31 and 32 are formed respectively on the upper surfaces of the conductor patterns 25 and 26 through the dielectric film 4. The conductor patterns 31 and 32 belong to the conductor layer MM positioned between the conductor layers M1 and M2 to constitute a capacitor upper electrode. This forms a capacitor having the conductor pattern 25 as the lower electrode and the conductor pattern 31 as the upper electrode and a capacitor having the conductor pattern 26 as the lower electrode and the conductor pattern 32 as the upper electrode. The conductor layer MM is smaller in thickness than the conductor layers M1 and M2, whereby the pattern accuracy of the conductor layer MM is enhanced. The conductor layers M1 and MM are covered with an insulating layer 11 made of a resin material such as polyimide.

As illustrated in FIG. 4, vias 41 to 47 are formed in the insulating layer 11 so as to expose the conductor layers M1 and MM. The vias 41 to 44 are formed at positions exposing respectively the conductor patterns 21 to 24, the via 45 is formed at a position exposing the end portion of the conductor pattern 25, and the vias 46 and 47 are formed at positions exposing respectively the conductor patterns 31 and 32.

The conductor layer M2 is the second conductor layer, which is provided on the surface of the insulating layer 11 and includes conductor patterns 51 to 58 as illustrated in FIG. 5. The conductor patterns 51 to 54 each serve as a terminal electrode pattern, the conductor pattern 55 having a loop-like shape serves an inductor pattern, the conductor pattern 56 serves as a dummy pattern, and the conductor pattern 57 serves as a lead-out pattern for the upper electrode. The conductor patterns 51 to 54 are connected to the conductor patterns 21 to 24 respectively through the vias 41 to 44. One end of the conductor pattern 55 is connected to the other end of the conductor pattern 25 through the via 45, and the other end of the conductor pattern 55 is connected to the conductor patterns 56, 57 and to the conductor pattern 31 through the via 46. The conductor pattern 57 is connected to the conductor pattern 32 through the via 47.

Figure 6:
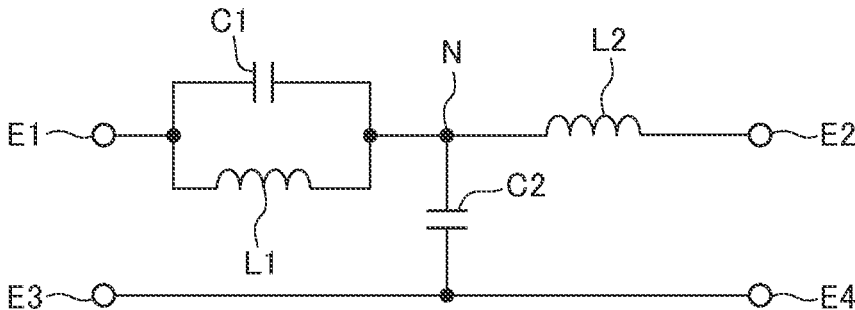
FIG. 6 is an equivalent circuit diagram of the electronic component 1.

FIG. 6 is an equivalent circuit diagram of the electronic component 1 according to the present embodiment.

As illustrated in FIG. 6, the electronic component 1 according to the present embodiment has a circuit configuration in which a capacitor C1 and an inductor L1 are connected in parallel to each other between a terminal electrode E1 and an internal node N, an inductor L2 is connected between a terminal electrode E2 and the internal node N, and a capacitor C2 is connected between terminal electrodes E3, E4 and the internal node N. The terminal electrode E1 corresponds to the conductor patterns 21 and 52, the terminal electrode E2 corresponds to the conductor patterns 22 and 52, the terminal electrode E3 corresponds to the conductor patterns 23 and 53, and the terminal electrode E4 corresponds to the conductor patterns 24 and 54. The internal node N corresponds to the conductor pattern 57. The capacitor C1 uses a part of the conductor pattern 25 as its lower electrode and uses the conductor pattern 31 as its upper electrode. The capacitor C2 uses a part of the conductor pattern 26 as its lower electrode and uses the conductor pattern 32 as its upper electrode. The inductor L1 is constituted by the conductor patterns 25 and 55, and the inductor L2 is constituted by the conductor pattern 58.

The conductor pattern 56 constituting the dummy pattern is a pattern branching from the other end of the conductor pattern 55 constituting the inductor pattern and is provided at a position overlapping the conductor pattern 31 constituting the upper electrode in a plan view. As illustrated in FIG. 1, in the present embodiment, the conductor pattern 31 is entirely covered with the conductor patterns 55 and 56. The conductor pattern 56, which is the dummy pattern that does not substantially contribute to an LC filter function, serves to prevent peeling at the interface between the conductor pattern 25 and the dielectric film 4 immediately below the conductor pattern 31 by covering a large part of the conductor pattern 31.

Figure 7A:
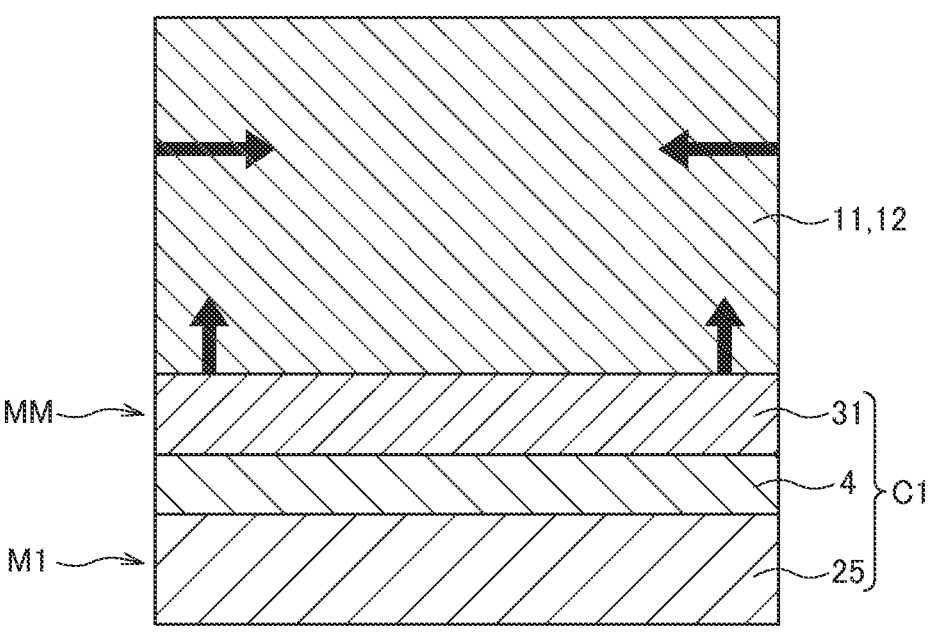
FIGS. 7A and 7B are schematic views for explaining a mechanism causing peeling at the interface between the conductor pattern 25 and the dielectric film 4, where
Figure 7B:
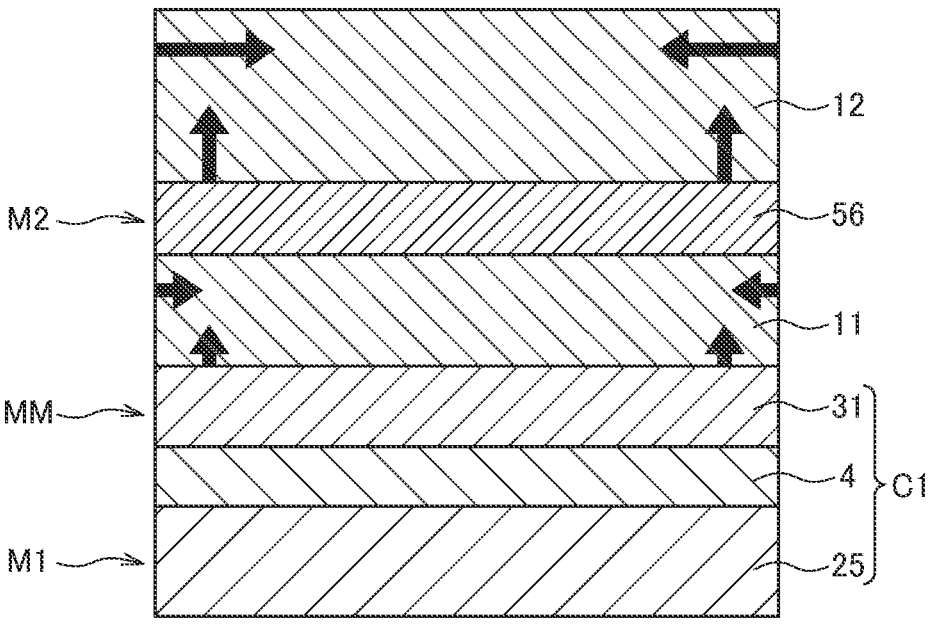

FIGS. 7A and 7B are schematic views for explaining a mechanism causing peeling at the interface between the conductor pattern 25 and the dielectric film 4. FIG. 7A illustrates a state where no dummy pattern is present, and FIG. 7B illustrates a state where the conductor pattern 56 serving as the dummy pattern is present.

As illustrated in FIG. 7A, when no dummy pattern is present immediately above the conductor pattern 31 as the upper electrode, the conductor pattern 31 is covered with a laminated body of the insulating layers 11 and 12. Thus, a tensile stress generated when curing the insulating layers 11 and 12 is directly applied to the conductor pattern 31 to cause peeling at the interface between the conductor pattern 25 and the dielectric film 4 which are low in adhesion to each other, which disadvantageously changes a capacitance to a value different from a designed one. On the other hand, when the conductor pattern 56 serving as the dummy pattern is provided immediately above the conductor pattern 31 as the upper electrode, at least the tensile force generated when curing the insulating layer 12 is not directly applied to the conductor pattern 31, making it less likely to cause peeling at the interface between the conductor pattern 25 and dielectric film 4. Thus, by covering the conductor pattern 31 as the upper electrode with the conductor pattern 56 as the dummy pattern, interfacial peeling can be prevented.

As described above, in the electronic component 1 according to the present embodiment, the conductor pattern 31 as the upper electrode is covered with the conductor pattern 56 as the dummy pattern, so that it is possible to prevent peeling at the interface between the conductor pattern 25 and the dielectric film 4. Further, the conductor pattern 56 branches from the conductor pattern 55 as the inductor pattern and has an opened end portion, so that circuit characteristics of the electronic component 1 are not varied significantly by the conductor pattern 56. In addition, a part of the conductor pattern 25 as the inductor pattern is used as the capacitor lower electrode, contributing to a reduction in chip size.

Figure 8:
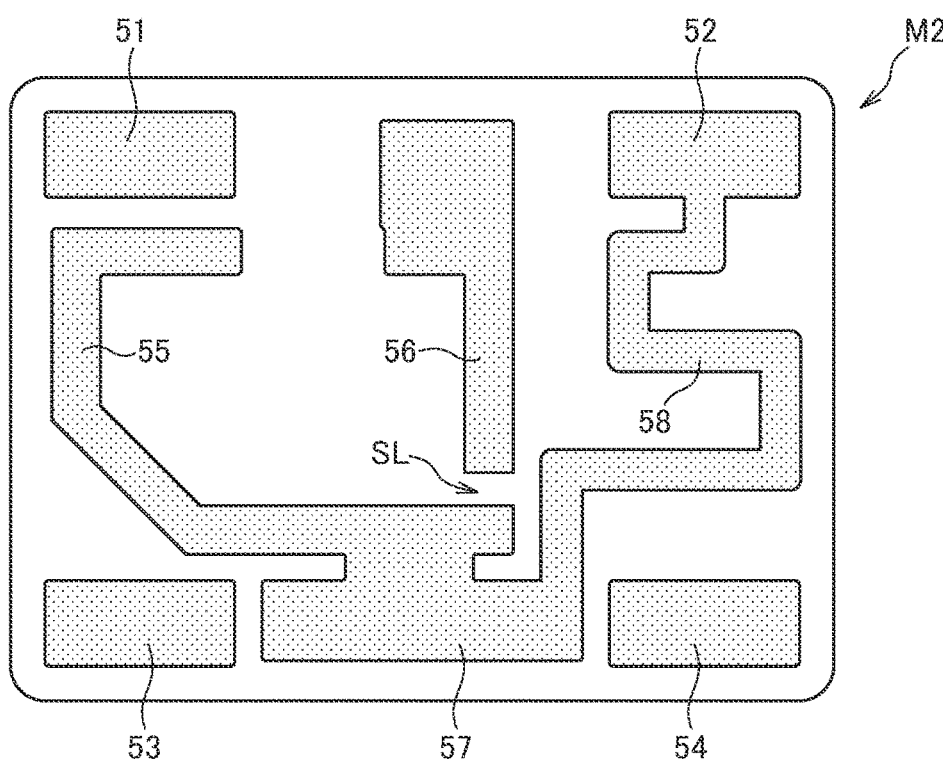
FIG. 8 is a schematic plan view illustrating the pattern shape of the conductor layer M2 according to a first modification.

FIG. 8 is a schematic plan view illustrating the pattern shape of the conductor layer M2 according to a first modification.

The first modification illustrated in FIG. 8 differs from the electronic component 1 according to the above embodiment in that the conductor pattern 56 as the dummy pattern is provided independently of the conductor pattern 55 as the inductor pattern. Other basic configurations are the same as those of the electronic component 1 according to the above embodiment, so the same reference numerals are given to the same elements, and overlapping description will be omitted. When the conductor pattern 56 as the dummy pattern is separated from other conductor patterns to be in a floating state as in the first modification, it is possible to prevent circuit characteristics of the electronic component from being varied by the conductor pattern 56, thus facilitating designing. In this case, the conductor pattern 31 is not covered with the conductor layer M2 at a position overlapping a slit SL for separating the conductor patterns 55 and 56, so that it is preferable to make the width of the slit SL as small as possible in order to prevent interfacial peeling.

Figure 9:
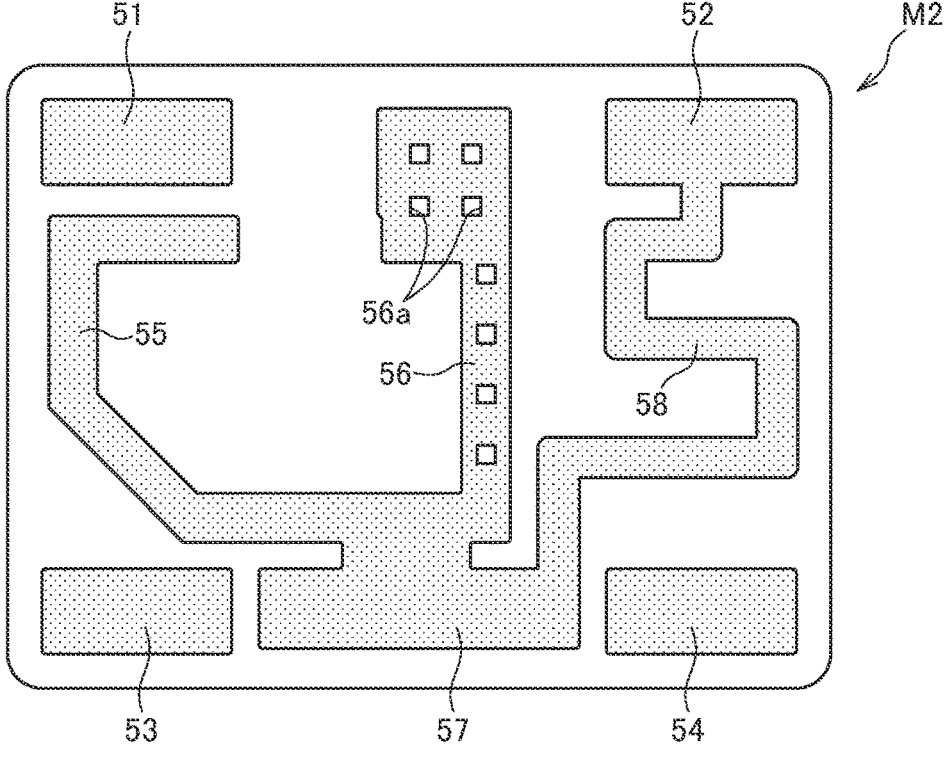
FIG. 9 is a schematic plan view illustrating the pattern shape of the conductor layer M2 according to a second modification.

FIG. 9 is a schematic plan view illustrating the pattern shape of the conductor layer M2 according to a second modification.

The second modification illustrated in FIG. 9 differs from the electronic component 1 according to the above embodiment in that the conductor pattern 56 as the dummy pattern has a plurality of openings 56a exposing the insulating layer 11. Other basic configurations are the same as those of the electronic component 1 according to the above embodiment, so the same reference numerals are given to the same elements, and overlapping description will be omitted. When the conductor pattern 56 as the dummy pattern has the plurality of openings 56a as in the second modification, it is possible to release gas generated during curing of the insulating layer 11 from the openings 56a even when the conductor patter 56 as the dummy pattern is large in area.

Figure 10:
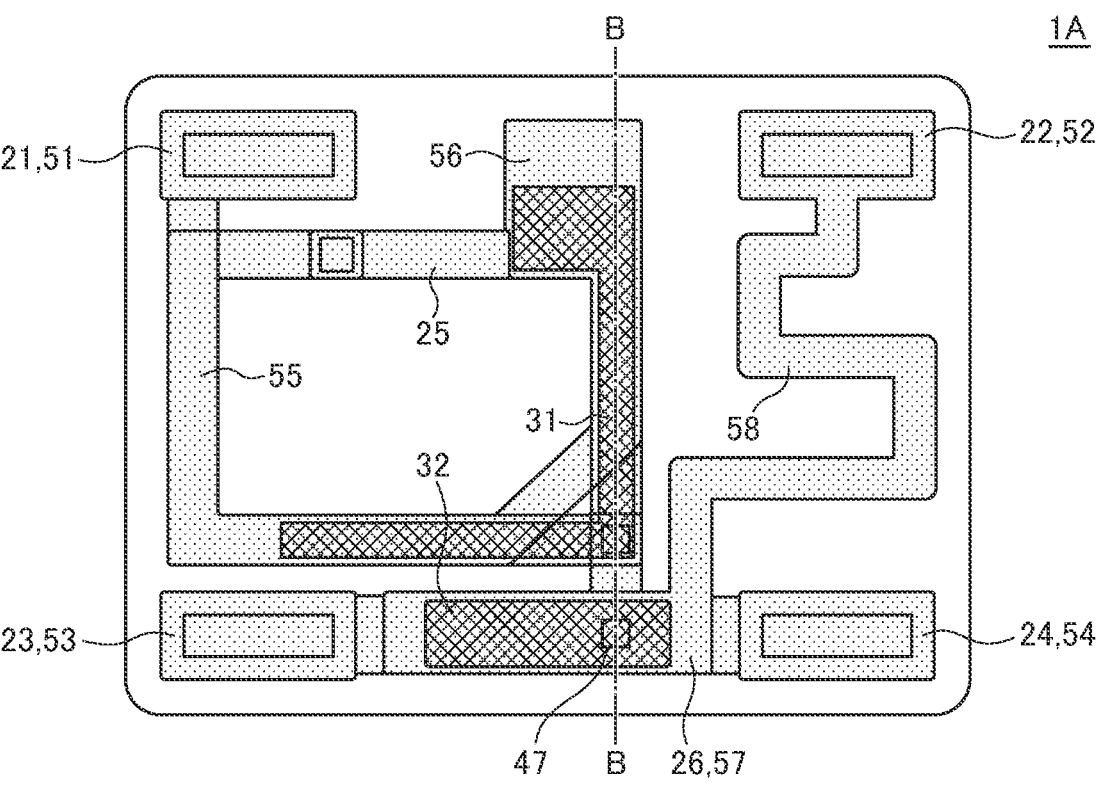
FIG. 10 is a schematic plan view for explaining the structure of an electronic component 1A according to a modification.
Figure 11:
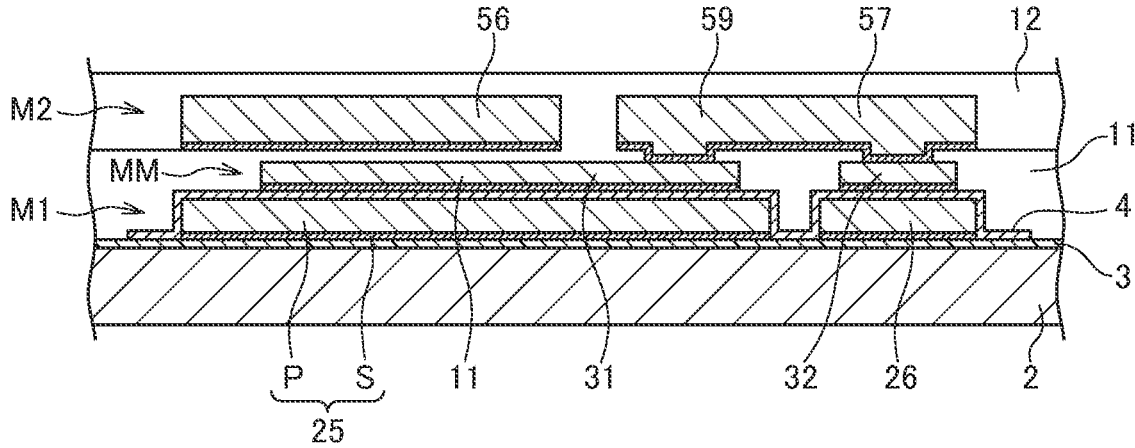
FIG. 11 is a schematic cross-sectional view taken along the line B-B of FIG. 10.

FIG. 10 is a schematic plan view for explaining the structure of an electronic component 1A according to a modification. FIG. 11 is a schematic cross-sectional view taken along the line B-B of FIG. 10.

Figure 12:
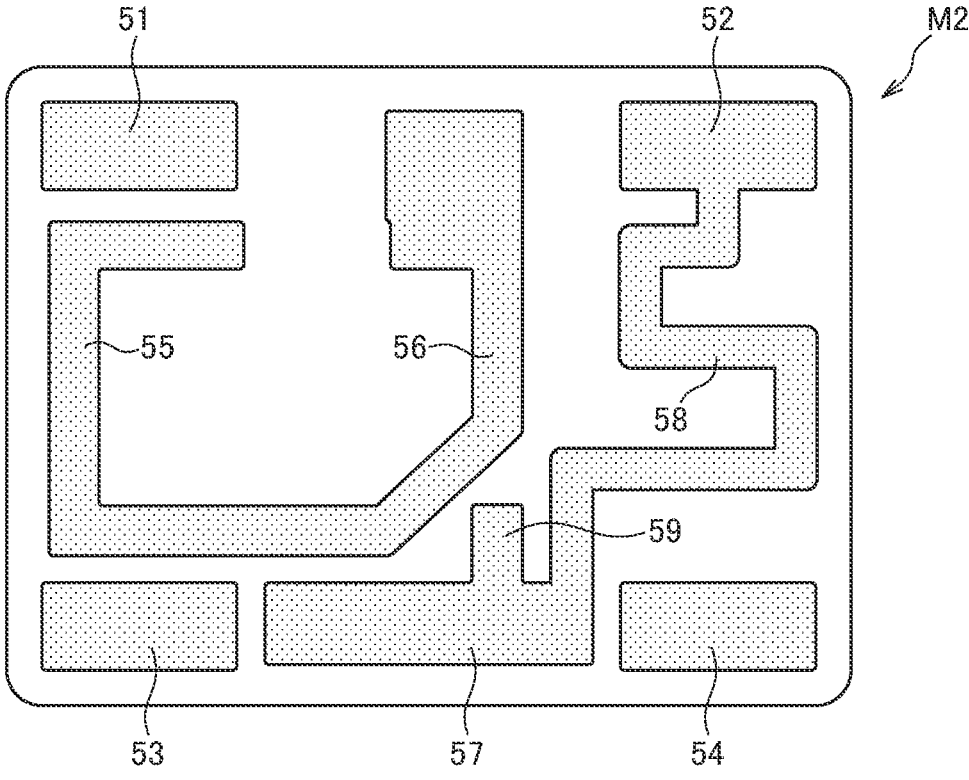
FIG. 12 is a schematic plan view illustrating the pattern shape of the conductor layer M2 in the electronic component 1A.

In the electronic component 1A according to the present modification, a conductor pattern 59 is added to the conductor layer M2. FIG. 12 is a schematic plan view illustrating the pattern shape of the conductor layer M2 in the electronic component 1A. As illustrated in FIGS. 10 to 12, the conductor pattern 59 branches from the conductor pattern 57. The conductor patterns 55 and 56 are separated from the conductor patterns 57 and 59 in the surface of the conductor layer M2. As exemplified by the electronic component 1A according to the modification, the conductor pattern 31 as the capacitor upper electrode need not be directly connected to the conductor pattern 55 as the inductor pattern and the conductor pattern 56 as the dummy pattern and may be connected to the conductor pattern 59.

While the preferred embodiment of the present disclosure has been described, the present disclosure is not limited to the above embodiment, and various modifications may be made within the scope of the present disclosure, and all such modifications are included in the present disclosure.

REFERENCE SIGNS LIST

1, 1A electronic component
2 substrate
3 planarizing layer
4 dielectric film
11, 12 insulating layer
21-26, 31, 32, 51-59 conductor pattern
41-47 via
56a opening
C1,C2 capacitor
E1-E4 terminal electrode
L1,L2 inductor
M1, MM, M2 conductor layer
N internal node
P plating layer
S seed layer
SL slit

What is claimed is:
1. An electronic component comprising:
a first conductor layer including a first inductor pattern;
an upper electrode of a capacitor overlapping a part of the first inductor pattern through a dielectric film;
a first insulating layer covering the first conductor layer and the upper electrode;
a second conductor layer being disposed on the first insulating layer and including a second inductor pattern; and
a second insulating layer covering the second conductor layer,

wherein one end of the second inductor pattern is connected to one end of the first inductor pattern through a first via formed in the first insulating layer, wherein the part of the first inductor pattern is configured to form a lower electrode of the capacitor, wherein the second conductor layer further includes a dummy pattern formed to be branching from, or independently of, the second inductor pattern, and wherein the dummy pattern covers the upper electrode via the first insulating layer such that a part of the first insulating layer is sandwiched between the upper electrode and the dummy pattern in a stacking direction.

2. The electronic component as claimed in claim 1, wherein the upper electrode is connected to the second inductor pattern through a second via formed in the first insulating layer.

3. The electronic component as claimed in claim 2, wherein the second via is smaller than the upper electrode.

4. The electronic component as claimed in claim 1,
wherein the second conductor layer further includes a conductor pattern,
wherein the conductor pattern is separated from the second inductor pattern in a surface of the second conductor layer, and is connected to the upper electrode through a second via formed in the first insulating layer.

5. The electronic component as claimed in claim 1,
wherein the dummy pattern is formed to be branching from the second inductor pattern, and
the upper electrode is entirely covered with the dummy pattern or second inductor pattern.

6. The electronic component as claimed in claim 1, wherein the upper electrode has a lower surface facing the lower electrode with the dielectric film interposed therebetween and an upper surface facing the dummy pattern with the first insulating layer interposed therebetween.

7. The electronic component as claimed in claim 1, wherein the upper electrode includes a seed layer and a plating layer provided on the seed layer.

8. The electronic component as claimed in claim 1,
wherein the first inductor pattern includes a first section extending in a first direction and a second section extending in a second direction different from the first direction, and
wherein the upper electrode includes a third section extending in the first direction so as to overlap the first section of the first inductor pattern and a fourth section extending in the second direction so as to overlap the second section of the first inductor pattern.

9. The electronic component as claimed in claim 8,
wherein the second inductor pattern extends in the first direction so as to overlap the first section of the first inductor pattern and the third section of the upper electrode, and

wherein the dummy pattern extends in the second direction so as to overlap the second section of the first inductor pattern and the fourth section of the upper electrode.

10. An electronic component comprising:
a first conductor layer including a first inductor pattern;
an upper electrode of a capacitor overlapping a part of the first inductor pattern through a dielectric film;
a first insulating layer covering the first conductor layer and the upper electrode;
a second conductor layer being disposed on the first insulating layer and including a second inductor pattern; and
a second insulating layer covering the second conductor layer,
wherein one end of the second inductor pattern is connected to one end of the first inductor pattern through a first via formed in the first insulating layer,
the part of the first inductor pattern is configured to form a lower electrode of the capacitor,
the second conductor layer includes a dummy pattern, the dummy pattern covering the upper electrode and being formed to be branching from, or independently of, the second inductor pattern,
wherein the dummy pattern is formed to be independent of the second inductor pattern, and
the upper electrode is entirely covered with the dummy pattern or second inductor pattern except a part that overlaps a slit separating the dummy pattern and the second inductor pattern.

11. An electronic component comprising:
a first conductor layer including a first inductor pattern;
an upper electrode of a capacitor overlapping a part of the first inductor pattern through a dielectric film;
a first insulating layer covering the first conductor layer and the upper electrode;
a second conductor layer being disposed on the first insulating layer and including a second inductor pattern; and
a second insulating layer covering the second conductor layer,
wherein one end of the second inductor pattern is connected to one end of the first inductor pattern through a first via formed in the first insulating layer,
the part of the first inductor pattern is configured to form a lower electrode of the capacitor,
the second conductor layer includes a dummy pattern, the dummy pattern covering the upper electrode and being formed to be branching from, or independently of, the second inductor pattern, and
wherein the dummy pattern includes a plurality of openings exposing the first insulating layer.

* * * * *